(12) United States Patent
Aemireddy et al.

(10) Patent No.: US 7,626,777 B2
(45) Date of Patent: Dec. 1, 2009

(54) VARIABLE THRESHOLD BIPOLAR SIGNAL PEAK DETECTOR

(75) Inventors: Arvind R. Aemireddy, Irving, TX (US);
Ronen Malka, St. Louis Park, MN (US);
Jeffrey A. Gleason, Burnsville, MN (US); Scott M. O'Brien, Bloomington, MN (US)

(73) Assignee: Agere Systems Inc., Allentown, PA (US)

( * ) Notice: Subject to any disclaimer, the term of this patent is extended or adjusted under 35 U.S.C. 154(b) by 525 days.

(21) Appl. No.: 11/234,840

(22) Filed: Sep. 23, 2005

(65) Prior Publication Data

US 2007/0070534 A1      Mar. 29, 2007

(51) Int. Cl.
*G11B 5/02* (2006.01)
*G11B 27/36* (2006.01)

(52) U.S. Cl. .............................. 360/25; 360/31; 360/67

(58) Field of Classification Search ............... None
See application file for complete search history.

(56) References Cited

U.S. PATENT DOCUMENTS

| | | | |
|---|---|---|---|
| 5,527,110 A | 6/1996 | Abraham et al. | |
| 5,862,007 A | 1/1999 | Pham et al. | |
| 5,901,001 A | 5/1999 | Meyer et al. | |
| 6,049,763 A | 4/2000 | Christiansen et al. | |
| 6,071,007 A | 6/2000 | Schaenzer et al. | |
| 6,104,557 A | 8/2000 | Kasai et al. | |
| 6,175,457 B1 | 1/2001 | Flynn | |
| 6,265,869 B1 | 7/2001 | Takahashi | |
| 6,304,396 B1 | 10/2001 | Ramalho et al. | |
| 6,304,401 B1 | 10/2001 | Okamoto | |
| 6,414,806 B1 | 7/2002 | Gowda et al. | |
| 6,483,657 B1 | 11/2002 | Fioravanti et al. | |
| 6,494,085 B2 | 12/2002 | Wakefield et al. | |
| 6,603,416 B2 * | 8/2003 | Masenas et al. | 341/120 |
| 6,724,550 B2 | 4/2004 | Lim et al. | |
| 6,754,015 B2 | 6/2004 | Erden et al. | |
| 6,940,669 B2 | 9/2005 | Schaenzer | |

OTHER PUBLICATIONS

Lee, Aaron, et al; "CMOS Circuits for Thermal Asperity Detection and Recovery in Disk-Drive Read Channels"; date unknown.
Groen, Eric, et al; "Hard Drive Data Recovery System", Design Review, Senior Design Project; Iowa State University; Dec. 8, 1998.

* cited by examiner

*Primary Examiner*—Joseph H Feild
*Assistant Examiner*—Daniell L Negrón (57) ABSTRACT

A method and apparatus for detecting signal peaks caused by a thermal asperity event in a magnetic recording media to reduce data reading errors introduced by the thermal asperity event. A common mode voltage is determined for differential signals representing data bits read from the magnetic recording media and a threshold voltage produced responsive to the common mode voltage. A comparator determines if either of the differential signals exceeds the threshold voltage, thereby indicating the occurrence of a thermal asperity event.

52 Claims, 6 Drawing Sheets

VARIABLE THRESHOLD BIPOLAR SIGNAL PEAK DETECTOR

FIELD OF THE INVENTION

The present invention relates generally to signal peak detectors and more particularly to variable threshold bipolar signal peak detectors and associated methods of comparing an input signal to a predetermined value.

BACKGROUND OF THE INVENTION

Disc drive storage systems are commonly used for storing data in electronic products ranging from digital cameras to computer systems. A disk drive comprises a head assembly and an electronics assembly conventionally attached to the head assembly for controlling head operation and providing a communication link between the head assembly and a host device served by the disk drive. The disk drive further comprises a disk having a data-recording surface for storing information therein. The disk is rotated at a constant speed while a closed loop servo system controls head position. The head assembly further comprises a read head for reading data from the recording surface and a write head for writing data to the recording surface.

An exemplary disk drive storage system 10 (see FIG. 1) comprises a disk 12 comprising magnetic material within a recording surface region for storing information in the form of binary bits for later retrieval and processing by the host device. Information bits are written to the recording surface of the disk 12 by magnetizing magnetic material domains to represent a binary zero or a binary one. The domains retain the magnetization for later retrieval during a read operation.

Figure 1:
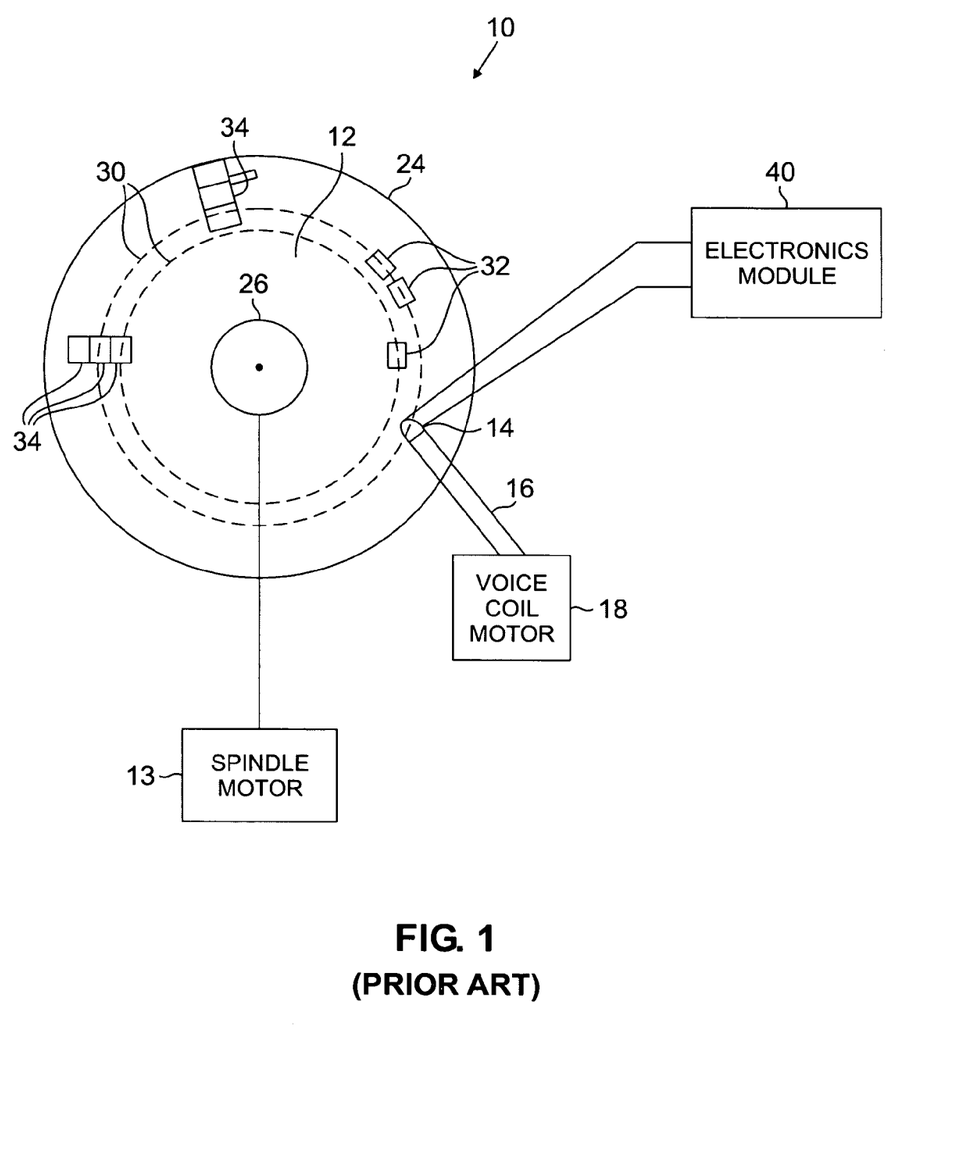
FIG. 1 is a partial block diagram of a prior art disk drive storage system to which the teachings of the present invention can be applied.

A spindle motor 13 rotates the disk 12 (typically at speeds up to 10,000 revolutions per minute) as a read/write head 14 disposed over an upper surface of the disk 12 writes data to or reads data from the disk 12. The read/write head 14 is affixed to a suspension arm 16 controlled by a voice coil motor 18 for moving the suspension arm 16 across the upper surface of the disk 12 along an arc extending between a disk circumference 24 and a hub 26. The physical features of the read/write head 14 and the suspension arm 16 allow the read/write head 14 to 'fly' over the disk upper surface at a distance referred to as a fly height. Contact between the head and the disk is to be avoided. The fly height is established to optimize performance of the read/write head 14 during read and write operations. An abrupt reduction in the operating fly height, for example, when the read/write head 14 encounters an asperity in the disk 12, may reduce the probability of returning correct read data to the host device.

The disk 12 comprises a plurality of concentric tracks 30 (typically 20,000 or more per radial inch) for storing binary data in fields 32 and head location information in servo bursts 34, where the latter provide feedback to the voice coil motor 18 for controlling head position along the tracks 30 (referred to as track following) and for moving the read/write head 14 rapidly and accurately between the tracks 30 (referred to as track accessing).

To write data to the disk 12, the voice coil motor 18 moves the suspension arm 16 to a desired radial position above the disk 12 while the disk 12 is rotating to position the region to be written under the read/write head 14. An electronics module 40 produces write current representing the data bits, as supplied by the host system, to be written to the disk 12. The write current is supplied to a coil (magnetically coupled to a magnetically permeable core) of an inductive writer in the read/write head 14 for producing a magnetic field. The magnetic field extends from the core across an air gap between the read/write head 14 and the disk's upper surface to magnetize a region of magnetic domains in the recording surface, thereby storing a data bit in the region.

The read/write head 14 comprises a read head including, in one embodiment, a magnetoresistive sensor that undergoes a change in electrical resistance in the presence of magnetic fields of selected orientation produced by the magnetic domains in the recording surface. During a read operation, a DC (direct current) bias voltage, e.g., of between about 0.025 V and 0.3 V, is supplied to the magnetoresistive sensor from the electronics module 40 to bias the read head.

During a data read or a servo read operation the suspension arm 16 moves while the disk 12 rotates to position the read/write head 14 (and thus the magnetoresistive sensor) above the magnetized region to be read. The magnetized disk region alters a resistance of the magnetoresistive sensor, generating an output signal comprising a relatively small AC (alternating current) voltage imposed on the DC bias voltage. The AC voltage, which is supplied to the electronics module 40, represents the magnetization of the read region of the disk 12, i.e., either a data one or a data zero. A preamplifier within the electronics module 40 receives and amplifies the AC voltage for further processing and decoding in a read channel of the module 40.

Continual advancements have led to higher storage capacity disks, higher data transfer rates during read and write operations and smaller magnitude read head signals representing the stored data bits. The use of magnetoresistive (MR) heads, giant magnetoresistive (GMR) heads and tunneling magnetoresistive (TMR) heads permits reduction of the fly height and correspondingly higher data storage densities. However, the reduced fly height introduces an increased likelihood of read signal distortion due to thermal interaction between the head and the disk. More particularly, changes in head temperature as the head flies over the disk surface, referred to as thermal asperities, introduce distortion in the read signals. Such thermal asperities are typically caused by physical contact between the head and contaminating oil or a contaminating particle on the disk 12. Thermal asperities can also be induced by flying height changes as the read/write head 14 passes over "hills" and "valleys" present on an irregular disk surface.

The effects of an asperity event on the magnetoresistive read head and on an output signal of a read channel responsive to the head signal are well known. When the head strikes a particle or magnetic media defect, referred to as a thermal asperity event, the head temperature can increase by more than 120° C. Due to the resistance temperature coefficient of the magnetoresistive sensor (about 0.02% per degree C.), the thermal asperity can cause a significant voltage transient or a DC baseline shift in the read signal amplitude, followed by a decaying signal amplitude having a duration of about two to five microseconds while the heat is released to the local environment as the head cools.

Figure 2:
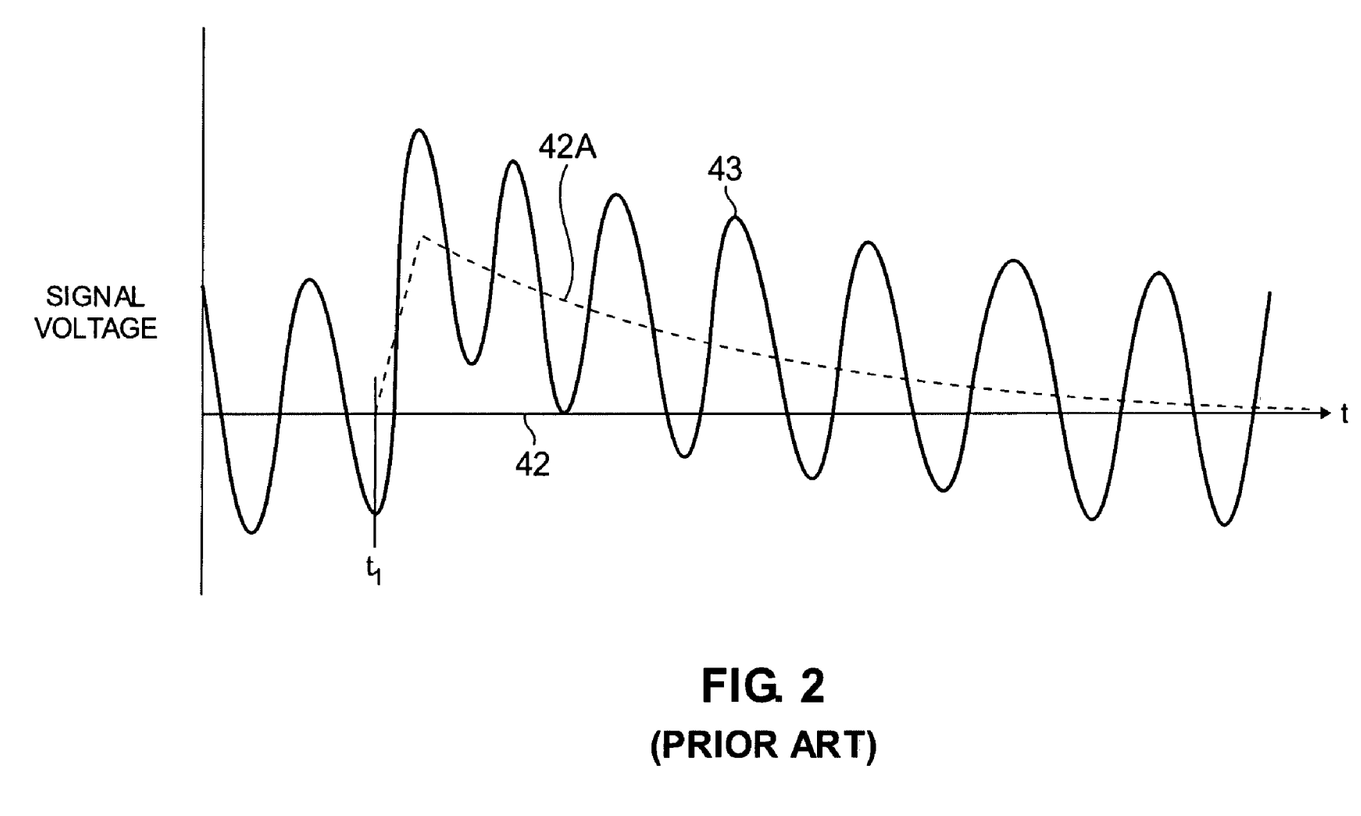
FIG. 2 is a time line illustrating a baseline shift due to a thermal asperity event in a disk drive system of FIG. 1.

FIG. 2 illustrates a quiescent DC bias voltage baseline 42 and a read signal 43 for decoding within the read channel to detect the read bit. A thermal asperity event occurs at a time $t_1$ and the resulting thermal effects on the read/write head 14 cause a baseline shift to a transient baseline 42A, increasing a DC level of the read signal 43. The baseline voltage shift resulting from the thermal asperity event may be in the range of about 5 mV to about 25 mV.

The thermal asperity event usually does not damage the head 14, but during the event the read signal is distorted as illustrated in FIG. 2, jeopardizing successful recovery of the data bits. Although the read channel includes error detection and correction features, a data re-read operation must be performed if the bit error rate during the event exceeds those error correction capabilities. As the magnetoresistive head cools, the baseline offset 42A decays back to the nominal baseline 42 as illustrated in FIG. 2.

In addition to data bit detection difficulties, the increasing read signal amplitude at the inception of the thermal asperity event can be coupled to the adjacent write head. The resulting write head current may saturate the magnetic recording medium in the area of the write head, erasing any recorded data in that region.

A thermal asperity event length can span the reading of a significant number of bytes from the disk-recording surface. For example, in a disk drive having a data transfer rate of 200 megabits per second (Mbits/sec), uncompensated thermal asperities have a duration from about two to five microseconds, distorting about 50 to 125 bytes of read data. As contaminates and disk surface corrosion build-up with use of the disk drive, the event duration lengthens. These effects further reduce the capabilities of a disk drive to reliably store and retrieve user data over its operational life.

Localized media anomalies can also cause problems in the storage and recovery of data from the disk 12, preventing the head 14 from recovering stored data. Typically these media anomalies generate a read signal disturbance signature similar to a thermal asperity event.

Various data and synchronization block formats have been utilized in an effort to compensate for thermal asperity effects, localized media anomalies and other anomalous disk conditions. For example, one format utilizes redundant first and second synchronization fields in each data block so that the stored data can be recovered if an anomalous condition prevents the read channel from correctly decoding one of the two synchronization fields. Further, the two synchronization fields in the data block are separated by a sufficient distance such that a thermal asperity coincident with a read operation on one of the synchronization fields does not interfere with a read operation on the other synchronization field.

According to another known technique, a thermal asperity detector determines when the read signal exceeds a predetermined threshold, ignores the read data during the asperity event and signals a disk drive controller to reread the sector after the asperity event has ended. The occurrence of second asperity event during the reread operation is not likely because the collision between the head and the particle usually moves the particle off the disk sector. Permanent, immobile defects in the disk storage media are rare.

A thermal asperity detector for use with a conventional disk drive 10 comprises a signal peak detector for determining when a read signal has exceeded a predetermined threshold, including thresholds indicating the possible occurrence of a thermal asperity event or another media anomaly. Various known peak detectors can detect either a positive polarity peak, a negative polarity peak, or both positive and negative polarity peaks. Also, the peak detector can detect cooling thermal asperities that are of the opposite polarity to the positive going heating thermal asperities described above.

Peak detectors for determining the occurrence of a thermal asperity event may not be able to accurately detect signal peaks in lower magnitude read signals produced by advanced-technology heads. False peak detections are also to be avoided.

Figure 3:
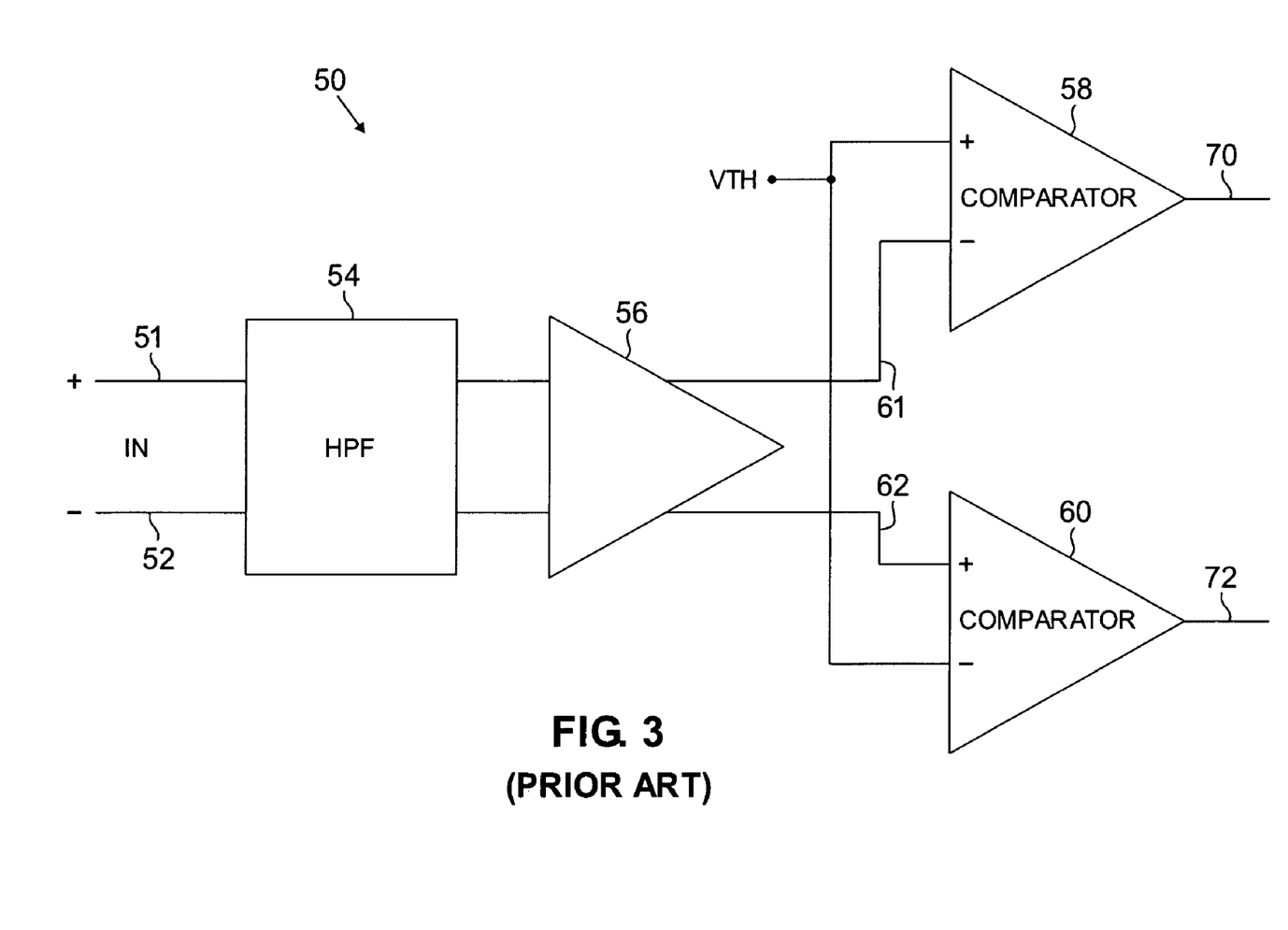
FIG. 3 is a partial block diagram and partial schematic diagram of a prior art differential peak detector.

FIG. 3 illustrates, in block diagram form, a prior art differential-input peak detector 50 capable of detecting both positive and negative polarity peaks in excess of a threshold value. A differential input signal is supplied from the read head 14 on conductors 51 and 52 to a high pass filter 54 for removing DC offset or DC bias levels in the input signal. An inverting amplifier 56 amplifies and inverts the differential signals input thereto from the filter 54 to produce a differential output signal supplied as inputs to comparators 58 and 60. Specifically, a first signal on an output conductor 61 is supplied to an inverting input terminal of the comparator 58. A second signal on an output conductor 62 is supplied to a non-inverting input terminal of the comparator 60.

A reference threshold voltage VTH is supplied to a non-inverting input terminal of the comparator 58 and to an inverting input terminal of the comparator 60. To limit variations in the reference voltage VTH with temperature, in one embodiment VTH is produced by a zero temperature coefficient current (i.e., the current does not vary with a temperature) flowing through a resistor (neither shown in FIG. 3).

The comparators 58 and 60 produce an output signal at respective output terminals 70 and 72 in response to a relationship between the signal present at the inverting terminal (for the comparator 60) or the non-inverting input terminal (for the comparator 58) and the reference voltage. The comparator 58 produces a high logic state output signal at the output terminal 70 when the threshold voltage is greater than the signal at the inverting input terminal. The comparator 60 produces a high logic state output signal on the output terminal 72 when the signal at the non-inverting input terminal is greater than the threshold voltage. Recognizing that the amplifier 56 is an inverting amplifier, input signal excursions above VTH are indicated by a high logic state of the comparator 58 and input signal excursions less than a negative VTH are indicated by a high logic state of the comparator 60. Thus the comparators 58 and 60 indicate the occurrence of a positive or negative signal peak having a magnitude greater than the threshold voltage VTH.

A gain of the amplifier 56 is typically between about 0.5 and 2; the gain is selected based on the expected amplitude range of the differential-input signals on the conductors 51 and 52 and on operating head room of the comparators 58 and 60. When using an amplifier with a relatively low gain, the reference voltage must be reduced and the comparators 58 and 60 must have the capability to process small amplitude signals, and to detect smaller differences between the input signal and the threshold to accurately detect a thermal asperity event. The use of a higher gain amplifier may appear to resolve this difficulty, but higher gains can introduce signal nonlinearities into the amplification process. For accurate detection of a thermal asperity event by peak signal detection, the effects of gain nonlinearities in the amplified differential-output signals produced by the amplifier 56 and in the reference voltage VTH must be minimized.

Figure 4:
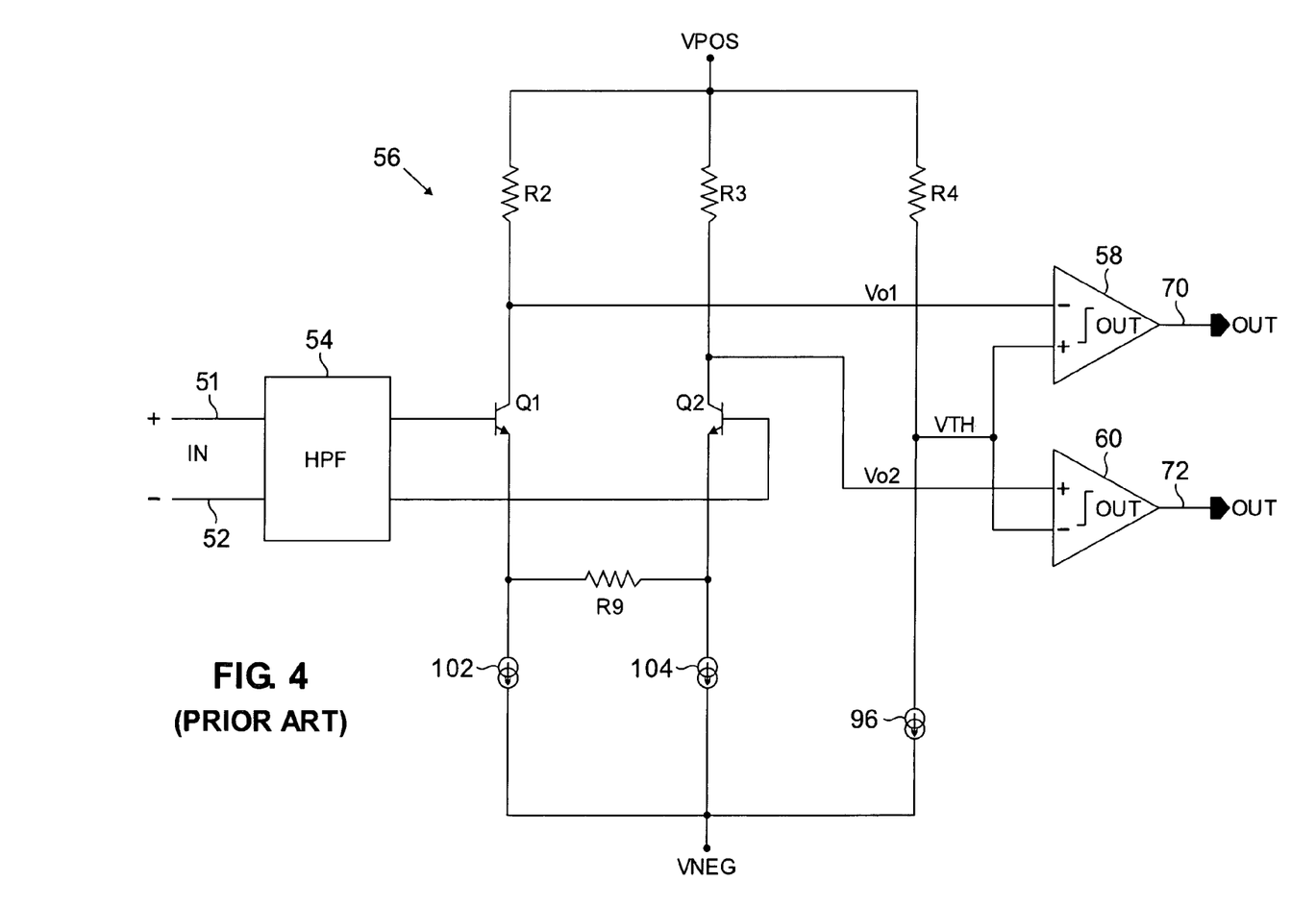
FIG. 4 is a schematic illustration of additional details of an amplifier of the differential peak detector of FIG. 3.

FIG. 4 illustrates in schematic form additional details of one embodiment of the amplifier 56. The reference voltage VTH is generated by a current supplied from a current source 96 through a resistor R4 and supplied to the non-inverting input terminal of the comparator 58 and to the inverting input terminal of the comparator 60. In another embodiment, the signals supplied to the inverting and non-inverting input terminals of the comparator 58 (and the comparator 60) are reversed with a corresponding reversal in the interpretation of the comparator output signal.

Bipolar junction transistors (BJTS) Q1 and Q2, each operative with a respective load resistor R2 and R3, operate as a bipolar differential amplifier, producing differential-output signals Vo1 and Vo2 in response to the differential input signals supplied from the high pass filter 54. The output signal Vo1 is supplied to the inverting input terminal of the comparator 58. The output signal Vo2 is supplied to the non-inverting input terminal of the comparator 60. In a preferred embodiment, the resistors R2 and R3 have the same resistance.

Positive and negative rail voltages (the latter can be ground in one embodiment) are identified as VPOS and VNEG in FIG. 4.

The resistor R4 and the current source 96 comprise a single-ended reference voltage generator producing the reference voltage VTH. In one embodiment the current source 96 comprises a zero temperature coefficient DAC (digital-to-analog converter) current source (referred to as an IDAC) responsive to a digital value that determines the current generated by the current source. The digital value is selected during manufacture of the of the disk drive 10 and stored in the electronics module 40, allowing the disk drive manufacturer to establish the reference voltage VTH and thereby determine the input signal level at which the comparators 58 and 60 trigger to indicate a signal peak greater than the threshold, e.g., to indicate the occurrence of a thermal asperity event.

Current sources 102 and 104 provide drive current through the resistors R2, R3 and R9, with the resistor R9 operative as a degeneration resistor for improving linearity (i.e., minimizing distortion) of the differential amplifier's response. To minimize nonlinearities in the differential amplifier's output signals, the input voltage differential between the input signals supplied to Q1 and Q2 should be small, permitting the bipolar junction transistors Q1 and Q2 to operate in a narrow linear region. The degeneration resistor R9 connected between the emitters of Q1 and Q2 drops a majority of the input differential voltage, reducing the input voltage differential between Q1 and Q2, increasing linearity in the operation of Q1 and Q2 and therefore increasing linearity in the operation of differential amplifier.

The affect of the resistor R9 on the linearity of the amplifier 56 is determined by a relationship between R9 and the transconductance parameter, gm, of the transistors Q1 and Q2. The amplifier 56 exhibits relatively good gain linearity for $1/gm << R9$. Ideally, it is desired that the bipolar differential amplifier 56 exhibit perfect gain linearity so as not to introduce nonlinear effects during the amplification process, as such nonlinear effects can impair the detection of positive and negative signal peaks by the comparators 58 and 60.

A gain of the bipolar differential amplifier 56 is approximated by a ratio 2R2/R9 (or 2R3/R9 since in a preferred embodiment where R2=R3). More precisely, the gain equals $2R2/(R9+2/gm)=2R3/(R9+2/gm)$, which simplifies to $2R2/R9=2R3/R9$ for $R9>>2/gm$. As is known, these gain equations are valid only for relatively low voltage or low magnitude input signals.

For high voltage input signals, the gain is not constant (i.e., not a constant function of R2 and R9) and therefore the voltages Vo1 and Vo2 input to the comparators 58 and 60 may not be as linear as desired. Thus a magnitude of the differential input signals supplied on the conductors 51 and 52 may cause a gain-induced nonlinearity in the detection process. Any such nonlinearity in the operation of the peak detector 50 may falsely indicate the occurrence of a thermal asperity event or fail to detect a thermal asperity event. All nonlinearities should be minimized.

Undesired signal nonlinearities may also occur in the generation of the reference threshold voltage VTH due to nonlinear operation of the current source 96, which may be caused by random process variations encountered while fabricating the individual components of the current source 96.

The BJTS Q1 and Q2 of the amplifier 56 illustrated in FIG. 4 may be replaced by respective MOSFETS (metal-oxide semiconductor field-effect transistors) M1 and M2 cooperatively operating as a MOSFET differential amplifier responsive to differential input signals supplied to MOSFET gate terminals from the filter 54. The MOSFET embodiments may be preferred for cost reasons when otherwise fabricating integrated circuits (such as the electronics module 40) with MOSFETS. That is, the incorporation of process steps for fabricating BJTS introduces cost and complexity into a MOSFET fabrication process.

Gain of a MOSFET differential amplifier is determined according to an equation that has the same form as the equation for the BJT differential amplifier of FIG. 4. That is, $2R2/(R9+2/gm)$ or $2R3/(R9+2/gm)$. Since a MOSFET transconductance is generally much smaller than a BJT transconductance, gain nonlinearities are greater in the MOSFET differential amplifier than in the corresponding BJT differential amplifier. Also, a pair of MOSFETS may have larger parameter offsets (random parameter mismatches due to the fabrication process variations, such as a threshold voltage mismatch) than a pair of bipolar junction transistors.

Given the relatively smaller transconductance and likelihood of larger parameter offsets, the MOSFET differential amplifier may introduce more nonlinear effects over a range of expected input signals than the BJT differential amplifier. The MOSFETS may also introduce greater nonlinearities into the amplification process than those attributable to the reference voltage VTH.

The output voltages of a differential amplifier can be mathematically expressed as an output voltage term plus an error term that accounts for parameter offsets between the two transistors comprising the differential amplifier. Thus the comparators 58 and 60 of FIG. 4 compare the threshold reference voltage VTH with Vo1±Verror1 and Vo2±Verror2, where Verror1 and Verror2 represent the transistor parameter offsets that contribute to undesired differences between Vo1 and Vo2. The error terms cause nonlinearities and asymmetries in the comparison process performed by the comparators 58 and 60, possibly generating comparator output signals that do not accurately represent the relationship between Vo1 and the threshold voltage VTH and between Vo2 and VTH.

Preferably, the peak detector 50 is a component of the preamplifier of the electronics module 40 for receiving signals representing the read data bits and for detecting a thermal asperity event in response thereto as described above.

BRIEF SUMMARY OF THE INVENTION

According to one embodiment, the present invention comprises a signal peak detector. The signal peak detector further comprises a differential amplifier responsive to first and second differential input signals to produce first and second differential output signals, a reference voltage generator configured to provide a third output signal representative of a common mode voltage of the first and second input signals and a comparator connected to determine a relation between the first and the second output signals and the third output signal.

Another embodiment of the present invention comprises a method for determining when a signal of a pair of differential input signals exceeds a predetermined signal threshold. The method further comprises amplifying the differential input signals to produce differential output signals, producing a reference voltage indicative of the signal threshold and related to a common mode voltage of the differential input signals and determining a relation between the differential output signals and the reference voltage, wherein the relation indicates if the signal of the pair of differential input signals exceeds the predetermined signal threshold.

BRIEF DESCRIPTION OF THE DRAWINGS

The foregoing and other features of the present invention will be apparent from the following more particular description of the invention as illustrated in the accompanying drawings, in which like reference characters refer to like features throughout the different figures. The drawings are not necessarily to scale, emphasis instead being placed upon illustrating the principles of the invention.

DETAILED DESCRIPTION OF THE INVENTION

Before describing in detail the particular variable peak detector circuit and method related thereto according to the present invention, it should be observed that the present invention resides in a novel and non-obvious combination of structural elements and process steps. Accordingly, these elements and process steps have been represented by conventional elements and steps in the drawings and specification, wherein elements and process steps conventionally known in the art are described in lesser detail and elements and steps pertinent to understanding the invention are described with greater detail.

The present invention is useful for detecting signal excursions that exceed a predetermined threshold, including excursions caused by media anomalies and thermal asperity events, while reading data from a disk drive data storage system.

Figure 5:
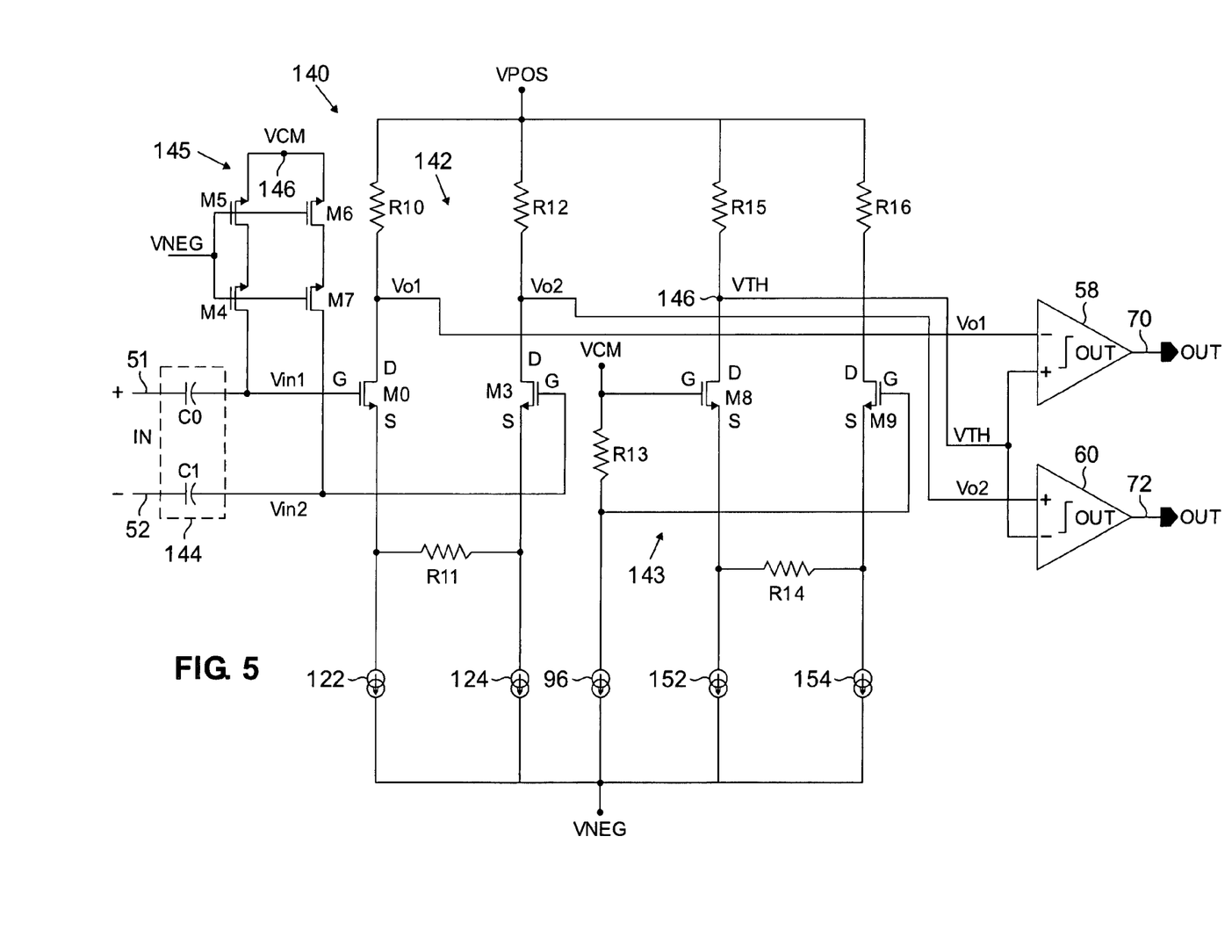
FIGS. 5 and 6 are schematic illustrations of peak detector circuit embodiments of the present invention.

FIG. 5 illustrates an embodiment of a signal peak detector circuit 140 comprising a differential input amplifier 142, a differential reference voltage generator 143 and comparators 58 and 60 (as described above with respect to FIG. 3) for receiving amplified version of the input signals.

A high pass filter 144 comprising capacitors C0 and C1 receives and filters differential read signals supplied on the conductors 51 and 52.

A center tap circuit 145 receives filtered differential signals Vin1 and Vin2 to determine a common mode voltage signal VCM (and its polarity) in the input signals. One example of a common mode voltage is a common mode DC bias voltage due to a thermal asperity event as described above in conjunction with FIG. 2.

The common mode voltage VCM, produced at a node 146 is supplied to the differential reference voltage generator 143, as further described below, for use in producing the threshold voltage VTH. Using the common mode voltage to produce the reference voltage causes the reference voltage to track the common mode component of the differential input voltages Vin1 and Vin2.

Since the components (e.g., MOSFETS) of the differential input amplifier 142 and the differential reference voltage generator 143 are fabricated according to the same process steps on the same integrated circuit, thus exhibiting substantially similar performance characteristics, process-induced nonlinearities in the output signals Vo1 and Vo2 of the differential input amplifier 142 would also appear in the output signal VTH (the reference voltage) of the differential reference voltage generator 143. Common fabrication of the differential input amplifier components and the differential reference voltage generator components minimizes nonlinearity mistracking between the input signals Vin1 and Vin2 and the threshold voltage VTH, permitting the comparators 58 and 60 to more accurately determine the relationship of the differential output signals Vo1 and Vo2 and the threshold voltage VTH, for example, to detect the occurrence of a thermal asperity event.

The center tap circuit 145 for determining the common mode voltage VCM (both magnitude and polarity of the common mode voltage) comprises MOSFETS M4, M5, M6 and M7, each having a gate G biased by the negative rail voltage VNEG. The MOSFETS M4, M5, M6 and M7 have a relatively large channel length and a relatively small channel width, causing each to operate in a triode region of its characteristic curve and to exhibit a relatively high channel resistance. In an alternative embodiment the MOSFETS M4, M5, M6 and M7 are replaced by conventional resistors, although when the center tap circuit 145 is implemented in an integrated circuit, the MOSFETS occupy less circuit area than the resistors.

The differential input amplifier 142, comprising input MOSFETS M0 and M3, respective drain resistors R10 and R12 and degeneration resistor R11, receives the filtered input signals Vin1 and Vin2 at respective gates G of the MOSFETS M0 and M3 for amplifying a difference between the input signals. In an ideal differential amplifier the difference between the two input signals is amplified and the common mode signal is rejected, i.e., the common mode signal has no effect on the output signals. The differential output signals Vo1 and Vo2 (representing a scaled up version of the input signals Vin1 and Vin2) at the drain of each of the MOSFETS M0 and M3, are supplied to respective inverting and non-inverting input terminals of the comparators 58 and 60. Drive current for the MOSFETS M0 and M3 is supplied by current sources 122 and 124, respectively.

The differential reference voltage generator 143 comprises MOSFETS M8 and M9, respective drain resistors R15 and R16, a gate resistor R13 and a degeneration resistor R14. Drive current for the MOSFETS M8 and M9 is supplied by current sources 152 and 154, respectively.

The voltage VCM, determined by the center tap circuit 145, is supplied to a gate G of the MOSFET M8. A voltage at a gate G of the MOSFET M9 is function of the current supplied by the IDAC 96 and the voltage VCM according to the equation (in an embodiment where the negative rail voltage VNEG is at ground potential):

$$M8 \text{ gate voltage} = VCM - (IDAC * R13).$$

The reference threshold voltage VTH, at node 146 (between the resistor R15 and drain D of the MOSFET M8), is supplied to the non-inverting input terminal of the comparator 58 and to the inverting input terminal of the comparator 60. Since the gate voltage of each of the MOSFETS M8 and M9 is responsive to the common mode voltage VCM, and further since the MOSFETS M8, M9, M0 and M2 are concurrently fabricated according to the same fabrication processes, the differential pair of MOSFETS M8 and M9 impose substantially similar nonlinearities in the threshold voltage VTH as the differential pair of MOSFETS M0 and M2 impose in generating the output signals Vo1 and Vo2. Since the threshold voltage VTH and the output signals Vo1 and Vo2 all exhibit substantially similar nonlinearities, the nonlinear effects effectively cancel, permitting the comparators 58 and 60 to more accurately determine the relationship between the output signals Vo1 and Vo2 and the reference threshold VTH, for example to detect a thermal asperity event. Thus MOSFET operational nonlinearities due to the relatively small MOSFET transconductance and fabrication-induced parameter offsets and operational nonlinearities are compensated.

The peak detector circuit 140 "pre-distorts" the threshold voltage VTH to compensate for nonlinear effects introduced by the differential pair comprising the MOSFETS M0 and M3, where the nonlinear effects are caused by large input signal magnitudes that cause the MOSFETS to operate in their nonlinear region (obviated by using the common mode voltage VCM to generate the threshold voltage VTH), by parameter offsets due to random fabrication anomalies (obviated by common fabrication of the differential amplifier MOSFETS M0 and M3 and the threshold generator MOSFETS M8 and M9) and/or by the relatively small MOSFET transconductance parameter.

When the peak detector circuit 140 operates to detect a thermal asperity event, the current supplied by the IDAC 96 is based on expected excursions in the input signals Vin1 and Vin2 caused by thermal asperity events during disk drive operation. As explained above, the IDAC current, in addition to the common mode voltage VCM, determines the threshold voltage VTH and thus the input signal level at which the comparators 58 and 60 indicate the occurrence of a thermal asperity event. During manufacture of the disk drive system the manufacturer may store a binary value for controlling the IDAC 96 in the electronics module 40. This value is supplied to the IDAC 95 during operation for use in generating the IDAC current.

A primary operational concern according to the prior art peak detectors was the introduction of nonlinearities in the differential output signals Vo1 and Vo2 by the input MOSFET pair M0 and M3. Such nonlinearities were primarily caused by large magnitude excursions of the input signals Vin1 and Vin2 on the conductors 51 and 52, in particular during a thermal asperity event, such that the input signals drive the MOSFETS M0 and M3 into nonlinear operation, producing nonlinearities in the output signals Vo1 and Vo2. Nonlinearities could also be introduced by parameter offsets, such as differences in gain or threshold voltage between the MOSFETS M0 and M3. Such parameter offsets are typically introduced by fabrication process anomalies.

According to the present invention, with the reference threshold voltage VTH derived from the common mode signal of Vin1 and Vin2, the same error terms and nonlinearities present in Vo1 and Vo2 are present in VTH, thus avoiding the effects of such nonlinearities during the comparison process performed by the comparators 58 and 60. Performance of the peak detector 140 is also improved since the MOSFETS M0, M3 of the differential input amplifier 142 and the MOSFETS M8 and M9 of the differential reference voltage generator 143 have similar operating characteristics, gain and performance offsets due to the common processes employed in their fabrication.

According to one embodiment, the differential reference voltage generator 143 provides an amplification factor substantially identical to that provided by the differential input amplifier 142. According to another embodiment, the components of the generator 143 are scaled relative to the components of the differential input amplifier 142 to reduce power consumption in the generator 143. For example, in one embodiment the differential reference voltage generator 143 is scaled by a factor of four with respect to the differential input amplifier 142, that is, the current sources 152 and 154 are scaled to deliver ¼ of the current of the current sources 122 and 124 and the channel of each MOSFET M8 and M9 is scaled by ¼ relative to the channel of each MOSFET M0 and M3. To produce a correctly proportioned reference voltage VTH from the generator 143 relative to the output signals Vo1 and Vo2, the resistor values R15 and R16 in the generator 143 are increased by a factor of four over the resistor values R10 and R12 in the differential input amplifier 142.

Figure 6:
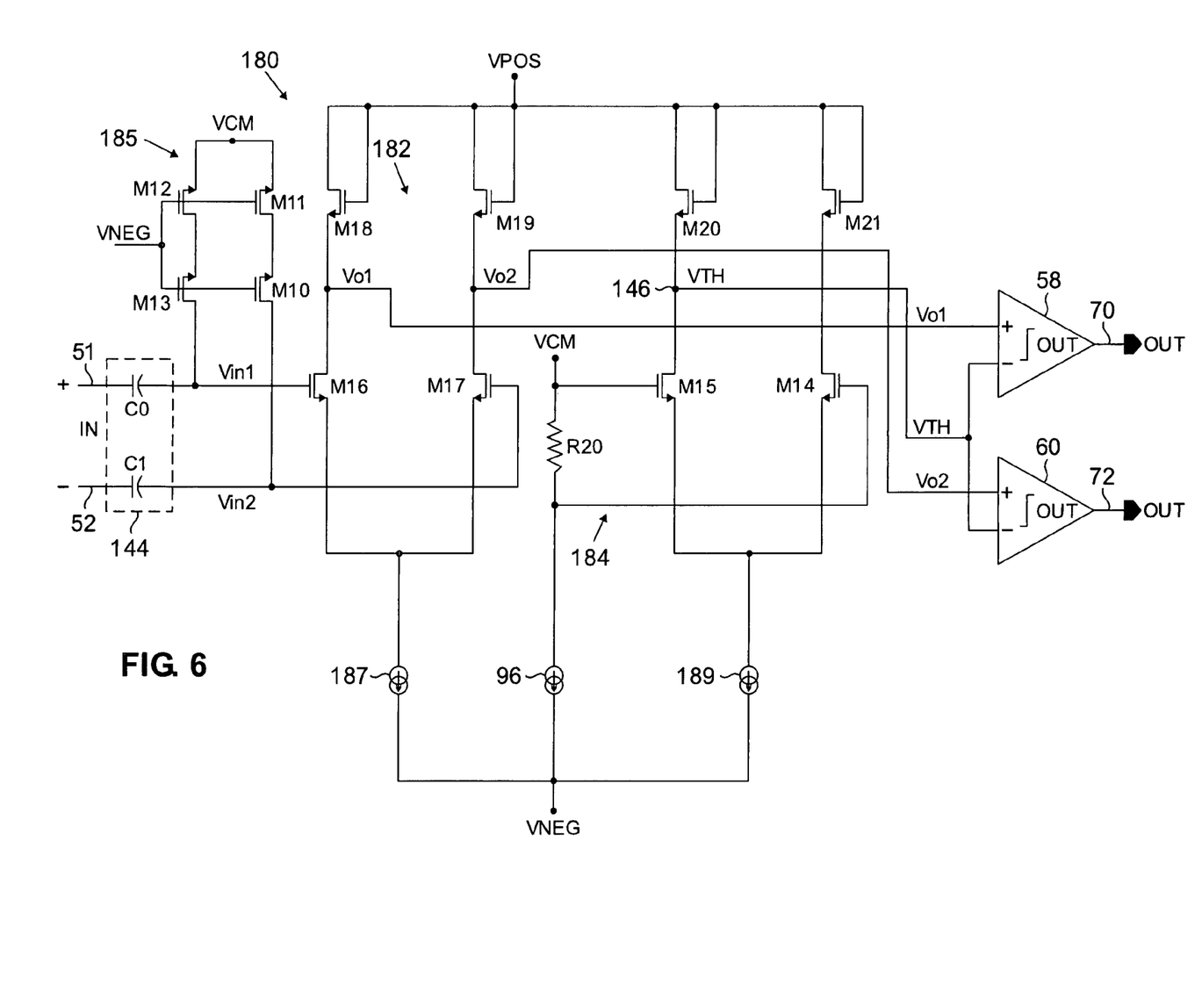

In a peak detector 180 illustrated in FIG. 6 and constructed according to another embodiment of the present invention, drain or load resistors R10, R12, R15 and R16 in the peak detector 140 of FIG. 5 are replaced by NMOSFET active loads M18, M19, M20 and M21, respectively, that exhibit substantially identical operating characteristics to MOSFETS M16 and M17 of a differential input amplifier 182 and to MOSFETS M15 and M14 of a differential reference voltage generator 184. The peak detector 180 may be especially advantageous for fabrication according to a CMOS process where the fabrication of resistors is minimized to cost limit fabrication costs.

MOSFETS M10, M11, M12 and M13 comprise a center tap circuit 185 that operates similar to the center tap circuit 145 of FIG. 5.

Drive current for the MOSFETS M16 and M17 is supplied by a current source 187 and drive current for the MOSFETS M16 and M14 is supplied by a current source 189.

According to one embodiment of the peak detector 180, channel dimensions of the MOSFETS M16 and M17 of the differential input amplifier 182 can be reduced below the channel dimensions of the MOSFETS M0 and M3 of the FIG. 5 embodiment. It may be desired to reduce the channel aspect ratio (W/L) of the MOSFETS M16 and M17 to increase the overdrive voltage (Vgs−Vt, where Vgs represents the MOSFET gate-source voltage and Vt represents the MOSFET threshold voltage) while maintaining a constant MOSFET output current. As the overdrive voltage (Vgs−Vt) increases, the output signal linearity improves. However, maintaining linearity according to this technique may not be critical, as the differential input amplifier 182 and the differential reference generator 184 track each other as described above.

By using NMOSFET active loads in the FIG. 6 embodiment, the area consumption and power consumption are reduced compared to the FIG. 5 embodiment. The amplifier 182 and the reference voltage generator 184 provide a more constant gain over fabrication process and temperature variations because only MOSFET devices are used (i.e., the resistors R10, R12, R15 and R16 are absent in the FIG. 6 embodiment). Further, the FIG. 6 embodiment uses only one current source for the input amplifier 182 and one current source for the differential reference voltage generator 184, unlike the embodiment of FIG. 5 that uses two current sources for each one of the amplifier 142 and the reference voltage generator 143.

Thus, according to the teachings of the present invention, a simple and reliable apparatus and method to improve the accuracy of MOSFET peak detectors is taught. These advantages are achieved without fabrication cost impact.

Although certain embodiments of the present invention depict and describe operation of the invention using NMOSFET devices, PMOSFET devices can be used in lieu thereof with corresponding changes in the polarity of the voltages supplied to the PMOSFET devices.

An apparatus and method have been described as useful for detecting bipolar signal peaks with respect to a threshold voltage. Specific applications and exemplary embodiments of the invention have been illustrated and discussed. These provide a basis for practicing the invention in a variety of ways and in a variety of circuit structures. Numerous variations are possible within the scope of the invention. Features and elements associated with one or more of the described embodiments are not to be construed as required elements for all embodiments. The invention is limited only by the claims that follow.

What is claimed is:

1. A signal peak detector, comprising:
a differential amplifier responsive to first and second differential input signals to produce first and second differential output signals;
a reference voltage generator configured to provide a third output signal representative of a common mode voltage of the first and second input signals; and
a comparator connected to determine a relation between the first and the second output signals and the third output signal wherein the relation between the first and the second output signals and the third output signal comprises the first output signal having a magnitude greater than a magnitude of the third output signal or the second output signal having a magnitude greater than a magnitude of the third output signal,
wherein the first and second output signals represent data bits read from a disk drive storage system, and wherein the third output signal comprises a reference signal representative of a signal peak in the first and the second output signals due to a thermal asperity event.

2. The signal peak detector of claim 1 wherein the comparator comprises:
a first comparator responsive to the first output signal and to the third output signal to produce a first comparator output signal responsive to a relation between the first output signal and the third output signal; and
a second comparator responsive to the second output signal and to the third output signal to produce a second comparator output signal responsive to a relation between the second output signal and the third output signal.

3. The signal peak detector of claim 1 wherein the reference voltage generator is responsive to a predetermined current through a resistor to determine the third output signal.

4. The signal peak detector of claim 1 further comprising a first and a second resistive element serially connected with a common node therebetween, the first resistive further comprising a terminal responsive to the first input signal and the second resistive element further comprising a terminal responsive to the second input signal, wherein the common mode voltage is produced at the common node.

5. The signal peak detector of claim 4 wherein the first and the second resistive elements each comprise a source/drain path of a metal-oxide semiconductor field effect transistor.

6. The signal peak detector of claim 1 wherein the reference voltage generator is responsive to a predetermined current through a resistor and the common mode voltage to determine the third output signal.

7. The signal peak detector of claim 1 further comprising a high pass filter configured to filter the first and the second input signals.

8. The signal peak detector of claim 1 wherein the comparator indicates the occurrence of a thermal asperity event when a magnitude of the first output signal exceeds the reference signal or a magnitude of the second output signal exceeds the reference signal.

9. The signal peak detector of claim 1 wherein the third output signal compensates nonlinearities in the operation of the differential amplifier.

10. The signal peak detector of claim 1 wherein the differential amplifier comprises differentially-connected first and second metal-oxide semi conductor field effect transistors and the reference voltage generator comprises differentially-connected third and fourth metal-oxide semiconductor field effect transistors, wherein the first, the second, the third and the fourth metal-oxide field effect transistors are fabricated according to a common fabrication process.

11. The signal peak detector of claim 10 wherein the first, the second, the third and the fourth metal-oxide field effect transistors exhibit substantially similar operating characteristics.

12. The signal peak detector of claim 10 wherein the first, the second, the third and the fourth metal-oxide field effect transistors exhibit substantially similar parameter offsets.

13. The signal peak detector of claim 10 wherein a gate of the first metal-oxide semiconductor field effect transistor is responsive to the first input signal to produce the first output signal at a source/drain thereof and a gate of the second metal-oxide semiconductor field effect transistor is responsive to the second input signal to produce the second output signal at a source/drain thereof.

14. The signal peak detector of claim 10 wherein a gate of the third metal-oxide semiconductor field effect transistor is responsive to the common mode signal and a gate of the fourth metal-oxide semiconductor field effect transistor is responsive to an input reference voltage, the reference voltage generator configured to provide the third output signal at a source/drain of the third metal-oxide semiconductor field effect transistor.

15. The signal peak detector of claim 14 wherein the input reference voltage comprises a difference between the common mode signal and a voltage developed by passing a current through a resistor.

16. The signal peak detector of claim 15 wherein the current comprises a current responsive to a predetermined binary value, wherein the binary value is selected responsive to peaks in the first and the second differential input signals.

17. The signal peak detector of claim 10 wherein nonlinear effects in the first and the second output signals due to operation of first and second metal-oxide semiconductor field effect transistors of the differential amplifier are substantially similar to nonlinear effects in the third output signal due to operation of third and the fourth metal-oxide semiconductor field effect transistors of the reference voltage generator.

18. The signal peak detector of claim 1 wherein the reference voltage generator comprises a differential reference voltage generator to provide the third output signal.

19. The signal peak detector of claim 1 wherein the third output signal tracks the common mode voltage of the differential input signals.

20. A signal detector for a magnetic data storage system comprising a magnetic storage medium and a read head producing differential read signals in response to magnetized domains of the storage medium, comprising:
a differential amplifier configured to provide first and second differential output signals responsive to the differential read signals;
a reference voltage generator configured to provide a reference signal based on a common mode voltage of the differential read signals wherein the reference signal compensates for nonlinearities in the operation of the differential amplifier; and
a comparator configured to determine a relation between the first and the second output signals and the reference signal.

21. The signal detector of claim 20 wherein the comparator comprises:
a first comparator responsive to the first output signal and the reference output signal to produce a first comparator output signal responsive to a relation between the first output signal and the first reference signal; and
a second comparator responsive to the second output signal and to the reference output signal to produce a second comparator output signal responsive to a relation between the second output signal and the reference signal.

22. The signal detector of claim 20 wherein the reference voltage generator is responsive to a predetermined current through a resistor to determine the reference signal.

23. The signal detector of claim 20 further comprising a first and a second resistive element serially connected with a common node therebetween, the first resistive element further comprising a terminal responsive to a first differential read signal and the second resistive element further comprising a terminal responsive to a second differential read signal, wherein the common mode voltage is produced at the common node.

24. The signal detector of claim 23 wherein the first and the second resistive elements each comprise a source/drain path of a metal-oxide semiconductor field effect transistor.

25. The signal detector of claim 20 wherein the reference voltage generator is responsive to a predetermined current through a resistor and the common mode voltage to determine the reference signal.

26. The signal detector of claim 20 wherein the relation between the first and the second output signals and the reference signal comprises the first output signal having a magnitude greater than a magnitude of the reference signal or the second output signal having a magnitude greater than the magnitude of the reference signal.

27. The signal detector of claim 20 wherein the comparator determines the occurrence of a thermal asperity event when a magnitude of the first output signal exceeds the reference signal or a magnitude of the second output signal exceeds the reference signal.

28. The signal detector of claim 20 wherein the differential amplifier comprises differentially-connected first and second metal-oxide semiconductor field effect transistors and the reference voltage generator comprises differentially-connected third and fourth metal-oxide semiconductor field effect transistors, wherein the first, the second, the third and the fourth metal-oxide field effect transistors are fabricated according to a common process.

29. The signal detector of claim 28 wherein a gate of each one of the first and the second metal-oxide semiconductor field effect transistors is responsive respectively to a first and a second read signal of the differential read signals for producing the first and the second output signals at a respective source/drain of the first and the second transistors.

30. The signal detector of claim 29 wherein a gate of the third metal-oxide semiconductor field effect transistor is responsive to the common mode signal and a gate of the fourth metal-oxide semiconductor field effect transistor is responsive to an input reference voltage, the reference voltage generator providing the reference signal at a source/drain of the third metal-oxide semiconductor field effect transistor.

31. The signal detector of claim 30 wherein the input reference voltage comprises a difference between the common mode signal and a voltage developed by passing a current through a resistor.

32. The signal detector of claim 31 wherein the current comprises a current responsive to a predetermined binary value, wherein the binary value is selected responsive to the differential read signals.

33. The signal detector of claim 20 wherein nonlinear effects in the first and the second output signals induced by operation of first and second metal-oxide semiconductor field effect transistors of the differential amplifier are substantially similar to nonlinear effects in the reference signal induced by operation of third and the fourth metal-oxide semiconductor field effect transistors of the reference voltage generator.

34. The signal detector of claim 20 wherein the reference signal tracks the common mode voltage of the differential read signals.

35. A preamplifier comprising a signal peak detector for a magnetic data storage system comprising a magnetic storage medium and a read head producing differential read signals in response to magnetized domains of the storage medium, the preamplifier comprising:
a differential amplifier configured to provide first and second differential output signals responsive to the differentials read signals;
a reference voltage generator configured to provide a reference signal based on a common mode voltage of the differential read signals; and
a comparator configured to determine a relation between the first and the second output signals and the reference signal wherein the comparator determines the occurrence of a thermal asperity event when a magnitude of the first output signal exceeds the reference signal or a magnitude of the second output signal exceeds the reference signal.

36. The preamplifier of claim 35 wherein the comparator comprises a first comparator to produce a first comparator signal responsive to a relation between the first output signal and the first reference signal, and a second comparator to produce a second comparator signal responsive to a relation between the second output signal and the reference signal.

37. The preamplifier of claim 36 wherein the first or the second comparator signal indicates the occurrence of a thermal asperity event on the magnetic storage medium.

38. The preamplifier of claim 35 further comprising a first and a second resistive element serially connected with a common node therebetween, the first resistive element further comprising a terminal responsive to a first differential read signal and the second resistive element further comprising a terminal responsive to a second differential read signal, wherein the common mode voltage is produced at the common node.

39. The preamplifier of claim 38 wherein the first and the second resistive elements each comprise a source/drain path of a metal-oxide semiconductor field effect transistor.

40. The preamplifier of claim 35 wherein the reference voltage generator is responsive to a predetermined current through a resistor and the common mode voltage to determine the reference signal.

41. The preamplifier of claim 35 wherein nonlinear operation of the reference voltage generator to provide the reference signal compensates for nonlinear operation of the differential amplifier to provide the first and the second differential output signals.

42. The preamplifier of claim 35 wherein the differential amplifier comprises differentially-connected first and second metal-oxide semiconductor field effect transistors and the reference voltage generator comprises differentially-connected third and fourth metal-oxide semiconductor field effect transistors, wherein the first, the second, the third and the fourth metal-oxide field effect transistors are fabricated according to a common process.

43. The preamplifier of claim 35 wherein nonlinear effects in the first and the second output signals induced by operation of first and second metal-oxide semiconductor field effect transistors of the differential amplifier are substantially similar to nonlinear effects in the reference signal induced by operation of third and the fourth metal-oxide semiconductor field effect transistors of the reference voltage generator.

44. The signal detector of claim 35 wherein the reference signal tracks the common mode voltage of the differential read signals.

45. A method for determining when a signal of a pair of differential input signals exceeds a predetermined signal threshold, the method comprising:
    amplifying the differential input signals to produce differential output signals;
    producing a reference voltage indicative of the signal threshold and related to a common mode voltage of the differential input signals wherein the differential output signals represent data bits read from a disk drive storage system, and wherein the reference voltage represents a signal peak of the differential output signals due to a thermal asperity event; and
    determining a relation between the differential output signals and the reference voltage, wherein the relation indicates if the signal of the pair of differential input signals exceeds the predetermined signal threshold.

46. The method of claim 45 wherein the step of producing the reference voltage further comprises differentially producing the reference voltage responsive to a predetermined current through a resistor and to the common mode voltage.

47. The method of claim 45 further comprising determining a common mode voltage based on the differential input signal.

48. The method of claim 45 wherein the step of determining the relation further comprises determining if a magnitude of a first signal of the differential output signals exceeds a magnitude of the reference voltage or if a magnitude of a second signal of the differential output signals exceeds the magnitude of the reference voltage.

49. The method of claim 45 wherein the reference voltage compensates nonlinearities occurring during the step of differentially amplifying.

50. The method of claim 45 wherein the step of amplifying the differential input signals further comprises differentially amplifying the differential input signals.

51. The method of claim 45 wherein the step of producing a reference voltage further comprises differentially producing the reference voltage.

52. The signal detector of claim 45 wherein the reference voltage tracks the common mode voltage of the differential input signals.

* * * * *